US009025794B2

(12) United States Patent
Takano et al.

(10) Patent No.: US 9,025,794 B2
(45) Date of Patent: May 5, 2015

(54) INTEGRATED CIRCUIT DEVICE, VOICE INPUT DEVICE AND INFORMATION PROCESSING SYSTEM

(75) Inventors: Rikuo Takano, Tsukuba (JP); Kiyoshi Sugiyama, Mitaka (JP); Toshimi Fukuoka, Yokohama (JP); Masatoshi Ono, Tsukuba (JP); Ryusuke Horibe, Daito (JP); Shigeo Maeda, Daito (JP); Fuminori Tanaka, Daito (JP); Takeshi Inoda, Daito (JP); Hideki Choji, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 1460 days.

(21) Appl. No.: 12/516,018

(22) PCT Filed: Nov. 21, 2007

(86) PCT No.: PCT/JP2007/072592

§ 371 (c)(1), (2), (4) Date: Jun. 23, 2010

(87) PCT Pub. No.: WO2008/062849

PCT Pub. Date: May 29, 2008

(65) Prior Publication Data

US 2010/0266146 A1 Oct. 21, 2010

(30) Foreign Application Priority Data

Nov. 22, 2006 (JP) ................................ 2006-315883
Nov. 19, 2007 (JP) ................................ 2007-299726

(51) Int. Cl.
*H03G 3/00* (2006.01)
*H04R 31/00* (2006.01)
(Continued)

(52) U.S. Cl.
CPC ................ *H04R 31/006* (2013.01); *H04R 1/04* (2013.01); *H04R 1/406* (2013.01); *H04R 19/005* (2013.01); *H04R 2499/11* (2013.01)

(58) Field of Classification Search
CPC .... H04R 19/005; H04R 2499/11; H04R 1/04; H04R 1/406; H04R 31/006; H04R 17/02; H04R 19/04; H04R 25/00; H04R 31/00; H04R 3/005
USPC ............. 381/104, 92, 91, 355, 356, 369, 170, 381/173, 174, 362, 122, 120, 113, 111; 29/294, 602.1
See application file for complete search history.

(56) References Cited

U.S. PATENT DOCUMENTS 5,546,458 A 8/1996 Iwami
5,825,897 A * 10/1998 Andrea et al. .............. 381/71.6
(Continued)

FOREIGN PATENT DOCUMENTS

JP 5-216495 A 8/1993
JP 6-269083 A 9/1994
(Continued)

OTHER PUBLICATIONS

U.S. Appl. No. 12/516,004, entitled "Voice Input Device, Method of Producing the Same and Information Processing System", filed May 22, 2009.
(Continued)

*Primary Examiner* — Lun-See Lao
(74) *Attorney, Agent, or Firm* — Crowell & Moring LLP

(57) ABSTRACT

An integrated circuit device includes a circuit board (1200'), the circuit board including a first diaphragm (714-1) that forms a first microphone, a second diaphragm (714-2) that forms a second microphone, and a differential signal generation circuit (720) that receives a first voltage signal obtained by the first microphone and a second voltage signal obtained by the second microphone, and generates a differential signal that indicates a difference between the first voltage signal and the second voltage signal.

4 Claims, 16 Drawing Sheets

(51) Int. Cl.

| | |
|---|---|
| ***H04R 1/04*** | (2006.01) |
| ***H04R 1/40*** | (2006.01) |
| *H04R 19/00* | (2006.01) |

(56) References Cited

U.S. PATENT DOCUMENTS

| | | | | |
|---|---|---|---|---|
| 5,969,838 | A | 10/1999 | Paritsky et al. | |
| 7,092,539 | B2 * | 8/2006 | Sheplak et al. | 381/114 |
| 7,751,575 | B1 * | 7/2010 | Baumhauer et al. | 381/92 |
| 2003/0147538 | A1 | 8/2003 | Elko | |
| 2005/0199975 | A1 | 9/2005 | Matubara | |
| 2006/0140431 | A1 * | 6/2006 | Zurek | 381/355 |
| 2007/0047746 | A1 * | 3/2007 | Weigold et al. | 381/174 |

FOREIGN PATENT DOCUMENTS

| | | | |
|---|---|---|---|
| JP | 7-312638 | A | 11/1995 |
| JP | 9-331377 | A | 12/1997 |
| JP | 2000-165998 | A | 6/2000 |
| JP | 2001-186241 | | 7/2001 |
| JP | 2002-84590 | A | 3/2002 |
| JP | 2003-32779 | A | 1/2003 |
| JP | 2003-333683 | A | 11/2003 |
| JP | 2004-173053 | A | 6/2004 |
| JP | 2005-203944 | A | 7/2005 |
| JP | 2005-217749 | A | 8/2005 |
| JP | 2005-260191 | A | 9/2005 |
| JP | 2006-174136 | A | 6/2006 |
| WO | WO 2004/098233 | A1 | 11/2004 |

OTHER PUBLICATIONS

U.S. Appl. No. 12/516,010, entitled "Voice Input Device, Method of Producing the Same and Information Processing System", filed May 22, 2009.

Supplementary European Search Report dated Aug. 29, 2011 (seven (7) pages).

International Search Report dated Feb. 5, 2008 (Two (2) pages).

* cited by examiner

INTEGRATED CIRCUIT DEVICE, VOICE INPUT DEVICE AND INFORMATION PROCESSING SYSTEM

CROSS-REFERENCE TO RELATED APPLICATIONS

This application contains subject matter related to U.S. application Ser. No. 12/516,004, entitled "Voice Input Device, Method of Producing the Same and Information Processing System," filed May 22, 2009 and U.S. application Ser. No. 12/516,010, entitled "Voice Input Device, Method of Producing the Same and Information Processing System, filed May 22, 2009.

TECHNICAL FIELD

The present invention relates to an integrated circuit device, a voice input device, and an information processing system.

BACKGROUND ART

It is desirable to pick up only desired sound (user's voice) during a telephone call, voice recognition, voice recording, or the like. However, sound (e.g., background noise) other than the desired sound may also be present in a usage environment of a voice input device. Therefore, a voice input device having a noise removal function has been developed.

As technology that removes noise in a usage environment in which noise is present, a method that provides a microphone with sharp directivity, and a method that detects the travel direction of sound waves utilizing the difference in sound wave arrival time and removes noise by signal processing have been known.

In recent years, since electronic instruments have been increasingly scaled down, technology that reduces the size of a voice input device has become important. JP-A-7-312638, JP-A-9-331377, and JP-A-2001-186241 disclose related-art technologies.

DISCLOSURE OF THE INVENTION

In order to provide a microphone with sharp directivity, it is necessary to arrange many diaphragms. This makes it difficult to reduce the size of a voice input device.

In order to detect the travel direction of sound waves utilizing the difference in sound wave arrival time, a plurality of diaphragms must be provided at intervals equal to a fraction of several wavelengths of an audible sound wave. This also makes it difficult to reduce the size of a voice input device.

Several aspects of the invention may provide an integrated circuit device that can implement a voice input element (microphone element) having a small size and a highly accurate noise removal function, a voice input device, and an information processing system.

(1) According to the invention, there is provided an integrated circuit device comprising a circuit board, the circuit board including:

a first diaphragm that forms a first microphone;

a second diaphragm that forms a second microphone; and a differential signal generation circuit that receives a first voltage signal obtained by the first microphone and a second voltage signal obtained by the second microphone, and generates a differential signal that indicates a difference between the first voltage signal and the second voltage signal.

The first diaphragm, the second diaphragm, and the differential signal generation circuit may be formed in the circuit board, or may be mounted on the circuit board by flip-chip mounting or the like.

The circuit board may be a semiconductor substrate, another circuit board (e.g., glass epoxy circuit board), or the like.

The difference in characteristics between the microphones due to an environment (e.g., temperature) can be suppressed by forming the first diaphragm and the second diaphragm on a single circuit board.

The differential signal generation circuit may have a function of adjusting the gain balance between the microphones. Therefore, a variation in gain of the microphones can be adjusted corresponding to each circuit board before shipment.

According to the invention, a signal that indicates a voice from which a noise component has been removed can be generated by a simple process that merely generates the differential signal that indicates the difference between the voltage signals.

According to the invention, an integrated circuit device that has a small size and can implement a highly accurate noise removal function can be provided.

The integrated circuit device according to the invention may be applied as a voice input element (microphone element) of a close-talking sound input device. In this case, the first diaphragm and the second diaphragm may be disposed so that a noise intensity ratio that indicates the ratio of the intensity of the noise component contained in the differential signal to the intensity of the noise component contained in the first voltage signal or the second voltage signal is smaller than an input voice intensity ratio that indicates the ratio of the intensity of an input voice component contained in the differential signal to the intensity of the input voice component contained in the first voltage signal or the second voltage signal. The noise intensity ratio may be an intensity ratio based on a phase difference component of noise, and the voice intensity ratio may be an intensity ratio based on an amplitude component of the input voice.

The integrated circuit device (semiconductor substrate) may be formed as a micro-electro-mechanical system (MEMS). The diaphragm may be an inorganic piezoelectric thin film or an organic piezoelectric thin film (i.e., the diaphragm achieves sound-electric conversion utilizing a piezoelectric effect).

(2) In the integrated circuit device according to the invention, the circuit board may be a semiconductor substrate; and the first diaphragm, the second diaphragm, and the differential signal generation circuit may be formed on the semiconductor substrate.

(3) In the integrated circuit device according to the invention, the circuit board may be a semiconductor substrate; and the first diaphragm and the second diaphragm may be formed on the semiconductor substrate, and the differential signal generation circuit may be flip-chip mounted on the semiconductor substrate.

The difference in characteristics between the microphones due to an environment (e.g., temperature) can be suppressed by forming the first diaphragm and the second diaphragm on a single semiconductor substrate.

The term "flip-chip mounting" refers to a mounting method that directly and electrically connect an integrated circuit (IC) element or an IC chip to a substrate in a state in which the circuit surface of the IC element or IC chip faces the substrate. When utilizing flip-chip mounting, the surface of the chip is electrically connected to the substrate through protruding terminals (bumps) that are arranged in an array instead of wire-bonding the surface of the chip to the substrate. Therefore, the mounting area can be reduced as compared with wire bonding.

(4) In the integrated circuit device according to the invention, the first diaphragm, the second diaphragm, and the differential signal generation circuit may be flip-chip mounted on the circuit board.

(5) In the integrated circuit device according to the invention, the circuit board may be a semiconductor substrate; and the differential signal generation circuit may be formed on the semiconductor substrate, and the first diaphragm and the second diaphragm may be flip-chip mounted on the semiconductor substrate.

(6) In the integrated circuit device according to the invention, a center-to-center distance between the first diaphragm and the second diaphragm may be 5.2 mm or less.

(7) In the integrated circuit device according to the invention, the first diaphragm and the second diaphragm may be silicon films.

(8) In the integrated circuit device according to the invention, the first diaphragm and the second diaphragm may be formed so that a normal to the first diaphragm is parallel to a normal to the second diaphragm.

(9) In the integrated circuit device according to the invention, the first diaphragm and the second diaphragm may be disposed at different positions in a direction perpendicular to a normal direction.

(10) In the integrated circuit device according to the invention, the first diaphragm and the second diaphragm may form bottoms of depressions formed in one side of the semiconductor substrate.

(11) In the integrated circuit device according to the invention, the first diaphragm and the second diaphragm may be disposed at different positions in a normal direction.

(12) In the integrated circuit device according to the invention, the first diaphragm may form a bottom of a first depression, and the second diaphragm may form a bottom of a second depression, the first depression and the second depression being respectively formed in a first side and a second side of the semiconductor substrate, the first side being opposite to the second side.

(13) In the integrated circuit device according to the invention, at least one of the first diaphragm and the second diaphragm may be configured to obtain sound waves through a tubular sound-guiding tube that is provided perpendicularly to a surface of the at least one of the first diaphragm and the second diaphragm.

When the sound-guiding tube is attached to the circuit board (substrate) around the diaphragm so that sound waves that enter the opening reach the diaphragm without leaking to the outside, sound that has entered the sound-guiding tube reaches the diaphragm without being attenuated. According to the invention, the travel distance of sound before reaching the diaphragm without being attenuated due to diffusion can be changed by providing the sound-guiding tube corresponding to at least one of the first diaphragm and the second diaphragm. Specifically, only the phase can be controlled while maintaining the amplitude of sound at the entrance of the sound-guiding tube. For example, a delay can be canceled by providing a sound-guiding tube having an appropriate length (e.g., several millimeters) corresponding to a variation in delay balance.

(14) In the integrated circuit device according to the invention, the differential signal generation circuit may include:

a gain section that amplifies the first voltage signal obtained by the first microphone by a predetermined gain; and a differential signal output section that receives the first voltage signal amplified by the gain section and the second voltage signal obtained by the second microphone, generates a differential signal that indicates a difference between the first voltage signal amplified by the gain section and the second voltage signal, and outputs the differential signal.

(15) In the integrated circuit device according to the invention, the differential signal generation circuit may include:

an amplitude difference detection section that receives the first voltage signal and the second voltage signal input to the differential signal output section, detects a difference in amplitude between the first voltage signal and the second voltage signal when the differential signal is generated based on the first voltage signal and the second voltage signal that have been received, generates an amplitude difference signal based on the detection result, and outputs the amplitude difference signal; and a gain control section that changes an amplification factor of the gain section based on the amplitude difference signal.

The amplitude difference detection section may include a first amplitude detection section that detects the amplitude of the signal output from the gain section, a second amplitude detection section that detects the amplitude of the second voltage signal obtained by the second microphone, and an amplitude difference signal generation section that detects the difference between the amplitude signal detected by the first amplitude detection means and the amplitude signal detected by the second amplitude detection means.

For example, a gain adjustment test sound source may be provided, and may be set so that sound output from the sound source is input to the first microphone and the second microphone at an equal sound pressure. The first microphone and the second microphone may receive the sound, and the waveforms of the first voltage signal and the second voltage signal may be monitored using an oscilloscope or the like. The amplification factor may be changed so that the amplitude of the first voltage signal coincides with the amplitude of the second voltage signal (or the difference in amplitude is within a predetermined range).

For example, the amplification factor of the gain section may be adjusted so that the difference in amplitude between the signals is within a range from −3% to +3% or a range from −6% to +6% with respect to the second voltage signal. When the difference in amplitude is within a range from −3% to +3% with respect to the second voltage signal, noise can be reduced by about 10 dB. When the difference in amplitude is within a range from −6% to +6% with respect to the second voltage signal, noise can be reduced by about 6 dB.

The predetermined gain may be controlled so that a predetermined noise reduction effect (e.g., by about 10 dB) is achieved.

According to the present invention, a variation in gain balance of the microphone that changes due to the usage state (usage environment or duration) can be detected in real time and can be adjusted.

(16) In the integrated circuit device according to the invention, the differential signal generation section may include:

the gain section that is configured so that an amplification factor is changed corresponding to a voltage applied to a predetermined terminal or a current that flows through the predetermined terminal; and a gain control section that controls the voltage applied to the predetermined terminal or the current that flows through the predetermined terminal, the gain control section including a resistor array in which a plurality of resistors are connected in series or parallel, or including at least one resistor, and configured so that the voltage applied to the predetermined terminal or the current that flows through the predetermined terminal can be changed by cutting some of the plurality of resistors or conductors that form the resistor array or cutting part of the at least one resistor.

Some of the resistors or conductors that form the resistor array may be cut using a laser, or may be fused by applying a high voltage or a high current A variation in gain balance that occurs during the microphone production process is determined, and the amplification factor of the first voltage signal is determined to cancel the difference in amplitude caused by the variation. The resistance of the gain control section is set at an appropriate value by cutting some of the resistors or conductors (e.g., fuses) that form the resistor array so that a voltage or a current that implements the determined amplification factor can be supplied to the predetermined terminal. This makes it possible to adjust the balance between the amplitude of the output from the gain section and the amplitude of the second voltage signal obtained by the second microphone.

(17) According to the invention, there is provided a voice input device comprising the above integrated circuit device.

According to the voice input device, a signal that indicates a voice from which a noise component has been removed can be generated by merely generating the differential signal that indicates the difference between the voltage signals. Therefore, a voice input device that enables a highly accurate speech recognition process, voice authentication process, or command generation process based on the input voice can be provided.

(18) According to the invention, there is provided an information processing system comprising:

the above integrated circuit device; and an analysis section that analyzes input voice information based on the differential signal.

According to this information processing system, the analysis section analyzes the input voice information based on the differential signal. Since the differential signal is considered to be a signal that indicates a voice component from which a noise component has been removed, various types of information processing based on the input voice can be performed by analyzing the differential signal.

The information processing system according to the invention may perform a voice recognition process, a voice authentication process, or a command generation process based on voice, for example.

(19) According to the invention, there is provided an information processing system comprising:

a voice input device that includes the above integrated circuit device and a communication processing device that performs a communication process through a network; and a host computer that analyzes input voice information input to the voice input device based on the differential signal acquired by a communication process through the network.

According to this information processing system, the analysis section analyzes the input voice information based on the differential signal. Since the differential signal is considered to be a signal that indicates a voice component from which a noise component has been removed, various types of information processing based on the input voice can be performed by analyzing the differential signal.

The information processing system according to the invention may perform a voice recognition process, a voice authentication process, or a command generation process based on voice, for example.

BEST MODE FOR CARRYING OUT THE INVENTION

Embodiments to which the invention is applied are described below with reference to the drawings. Note that the invention is not limited to the following embodiments. The invention encompasses arbitrary combinations of the elements of the following embodiments.

1. Configuration of Integrated Circuit Device

The configuration of an integrated circuit device 1 according to one embodiment to which the invention is applied is described below with reference to FIGS. 1 to 3. The integrated circuit device 1 according to this embodiment is configured as a voice input element (microphone element), and may be applied to a close-talking sound input device or the like.

Figure 1:
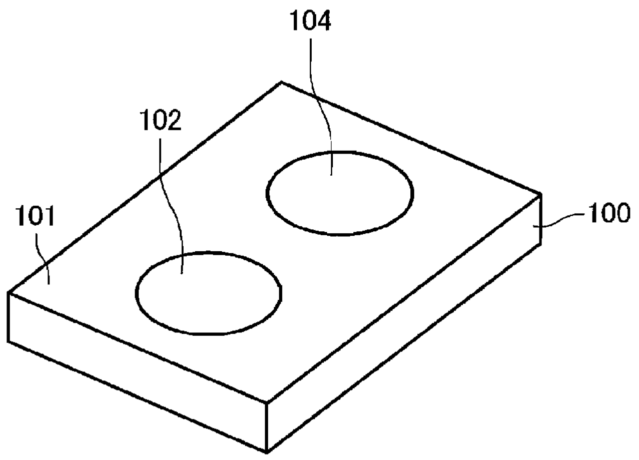
FIG. 1 illustrates an integrated circuit device.
Figure 2:
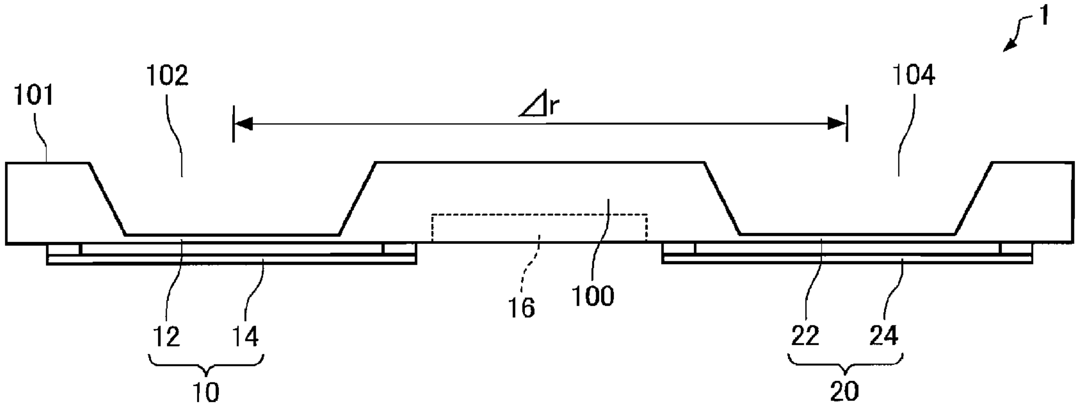
FIG. 2 illustrates an integrated circuit device.
Figure 3:
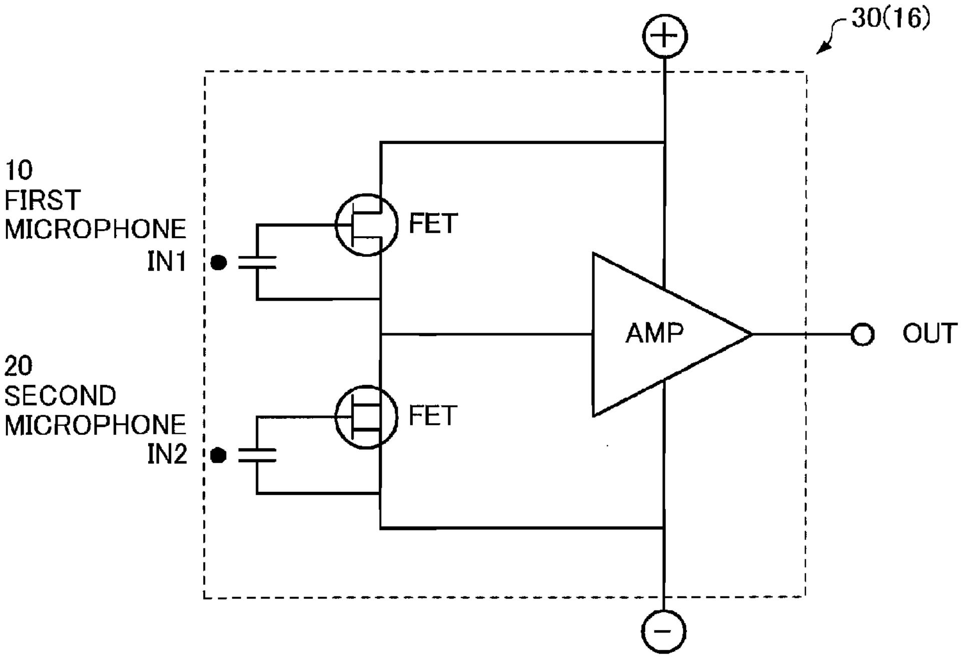
FIG. 3 illustrates an integrated circuit device.

As illustrated in FIGS. 1 and 2, the integrated circuit device 1 according to this embodiment includes a semiconductor substrate 100. FIG. 1 is a perspective view of the integrated circuit device 1 (semiconductor substrate 100), and FIG. 2 is a cross-sectional view of the integrated circuit device 1. The semiconductor substrate 100 may be a semiconductor chip. Alternatively, the semiconductor substrate 100 may be a semiconductor wafer that has a plurality of areas in which the integrated circuit device 1 is formed. The semiconductor substrate 100 may be a silicon substrate.

A first diaphragm 12 is formed on the semiconductor substrate 100. The first diaphragm 12 may be the bottom of a first depression 102 formed in a given side 101 of the semiconductor substrate 100. The first diaphragm 12 is a diaphragm that forms a first microphone 10. Specifically, the first diaphragm 12 is formed to vibrate when sound waves are incident on the first diaphragm 12. The first diaphragm 12 makes a pair with a first electrode 14 disposed opposite to the first diaphragm 12 at an interval from the first diaphragm 12 to form the first microphone 10. When sound waves are incident on the first diaphragm 12, the first diaphragm 12 vibrates so that the distance between the first diaphragm 12 and the first electrode 14 changes. As a result, the capacitance between the first diaphragm 12 and the first electrode 14 changes. The sound waves (sound waves incident on the first diaphragm 12) that cause the first diaphragm 12 to vibrate can be converted into and output as an electrical signal (voltage signal) by outputting the change in capacitance as a change in voltage, for example. The voltage signal output from the first microphone 10 is hereinafter referred to as a first voltage signal.

A second diaphragm 22 is formed on the semiconductor substrate 100. The second diaphragm 22 may be the bottom of a second depression 104 formed in the given side 101 of the semiconductor substrate 100. The second diaphragm 22 is a diaphragm that forms a second microphone 20. Specifically, the second diaphragm 22 is formed to vibrate when sound waves are incident on the second diaphragm 22. The second diaphragm 22 makes a pair with a second electrode 24 disposed opposite to the second diaphragm 22 at an interval from the second diaphragm 22 to form the second microphone 20. The second microphone 20 converts the sound waves (sound waves incident on the second diaphragm 22) that cause the second diaphragm 22 to vibrate into a voltage signal and outputs the voltage signal in the same manner as he first microphone 10. The voltage signal output from the second microphone 20 is hereinafter referred to as a second voltage signal.

In this embodiment, the first diaphragm 12 and the second diaphragm 22 are formed on the semiconductor substrate 100, and may be silicon films, for example. Specifically, the first microphone 10 and the second microphone 20 may be silicon microphones (Si microphones). A reduction in size and an increase in performance of the first microphone 10 and the second microphone 20 can be achieved by utilizing the silicon microphones. The first diaphragm 12 and the second diaphragm 22 may be disposed so that the normal to the first diaphragm 12 extends parallel to the normal to the second diaphragm 22. The first diaphragm 12 and the second diaphragm 22 may be disposed at different positions in the direction perpendicular to the normal direction.

The first electrode 14 and the second electrode 24 may be part of the semiconductor substrate 100, or may be conductors disposed on the semiconductor substrate 100. The first electrode 14 and the second electrode 24 may have a structure that is not affected by sound waves. For example, the first electrode 14 and the second electrode 24 may have a mesh structure.

An integrated circuit 16 is formed on the semiconductor substrate 100. The configuration of the integrated circuit 16 is not particularly limited. For example, the integrated circuit 16 may include an active element such as a transistor and a passive element such as a resistor.

The integrated circuit device according to this embodiment includes a differential signal generation circuit 30. The differential signal generation circuit 30 receives the first voltage signal and the second voltage signal, and generates (outputs) a differential signal that indicates the difference between the first voltage signal and the second voltage signal. The differential signal generation circuit 30 generates the differential signal without performing an analysis process (e.g., Fourier analysis) on the first voltage signal and the second voltage signal. The differential signal generation circuit 30 may be part of the integrated circuit 16 formed on the semiconductor substrate 100. FIG. 3 illustrates an example of a circuit diagram of the differential signal generation circuit 30. Note that the circuit configuration of the differential signal generation circuit 30 is not limited to the configuration illustrated in FIG. 3.

The integrated circuit device 1 according to this embodiment may further include a signal amplification circuit that amplifies (i.e., increases or decreases) the differential signal by a predetermined gain. The signal amplification circuit may be part of the integrated circuit 16. Note that the integrated circuit device may not include the signal amplification circuit.

In the integrated circuit device 1 according to this embodiment, the first diaphragm 12, the second diaphragm 22, and the integrated circuit 16 (differential signal generation circuit 30) are formed on the single semiconductor substrate 100. The semiconductor substrate 100 may be considered to be a micro-electro-mechanical system (MEMS). The diaphragm may be an inorganic piezoelectric thin film or an organic piezoelectric thin film (i.e., the diaphragm may achieve sound-electric conversion utilizing a piezoelectric effect). The first diaphragm 12 and the second diaphragm 22 can be formed accurately and closely by forming the first diaphragm 12 and the second diaphragm 22 on a single substrate (semiconductor substrate 100).

The integrated circuit device 1 according to this embodiment removes a noise component by utilizing the differential signal that indicates the difference between the first voltage signal and the second voltage signal, as described later. The first diaphragm 12 and the second diaphragm 22 may be disposed to satisfy predetermined conditions in order to implement the noise removal function with high accuracy. The details of the conditions that must be satisfied by the first diaphragm 12 and the second diaphragm 22 are described later. In this embodiment, the first diaphragm 12 and the second diaphragm 22 may be disposed so that a noise intensity ratio is smaller than an input voice intensity ratio. Therefore, the differential signal can be considered to be a signal that indicates a voice component from which a noise component has been removed. The first diaphragm 12 and the second diaphragm 22 may be disposed so that a center-to-center distance Δr between the first diaphragm 12 and the second diaphragm 22 is 5.2 mm or less, for example.

The integrated circuit device 1 according to this embodiment may be configured as described above. According to this embodiment, an integrated circuit device that can implement a highly accurate noise removal function can be provided. The noise removal principle is described later.

2. Noise Removal Function

The noise removal principle of the integrated circuit device 1 and conditions for implementing the noise removal function are described below.

(1) Noise Removal Principle

The noise removal principle is as follows.

Figure 4:
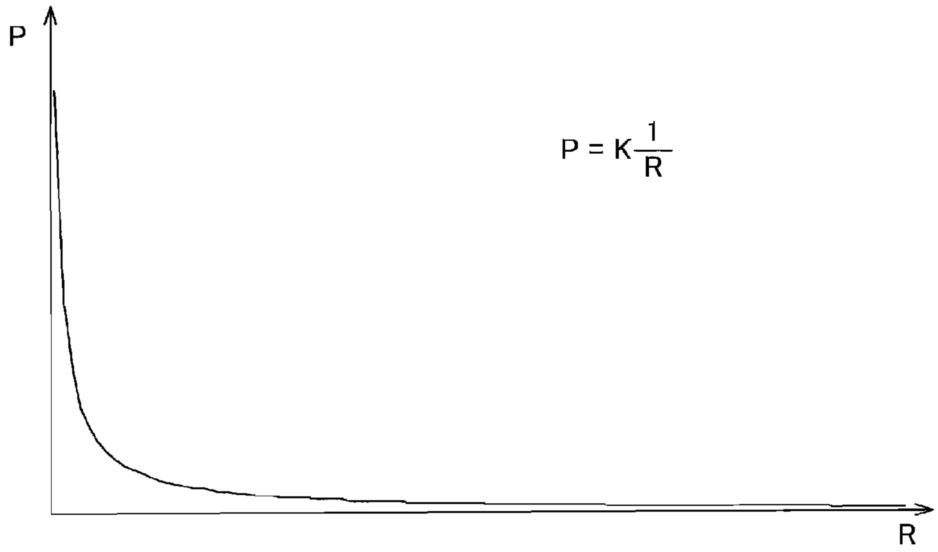
FIG. 4 illustrates an integrated circuit device.

Sound waves are attenuated during travel through a medium so that the sound pressure (i.e., the intensity/amplitude of the sound waves) decreases. Since a sound pressure is in inverse proportion to the distance from a sound source, a sound pressure P is expressed by the following expression with respect to the relationship with a distance R from a sound source, $$P = K\frac{1}{R} \tag{1}$$

where, k is a proportional constant. FIG. 4 illustrates a graph that indicates the expression (1). As illustrated in FIG. 4, the sound pressure (amplitude of sound waves) is rapidly attenuated at a position near the sound source (left of the graph), and is gently attenuated as the distance from the sound source increases. The integrated circuit device according to this embodiment removes a noise component by utilizing the above-mentioned attenuation characteristics.

Specifically, when applying the integrated circuit device 1 to a close-talking sound input device, the user talks at a position closer to the integrated circuit device 1 (first diaphragm 12 and second diaphragm 22) than the noise source. Therefore, the user's voice is attenuated to a large extent between the first diaphragm 12 and the second diaphragm 22 so that the user's voice contained in the first voltage signal differs in intensity from the user's voice contained in the second voltage signal. On the other hand, since the source of a noise component is situated at a position away from the integrated circuit device 1 as compared with the user's voice, the noise component is attenuated to only a small extent between the first diaphragm 12 and the second diaphragm 22. Therefore, a substantial difference in intensity does not occur between the noise contained in the first voltage signal and the noise contained in the second voltage signal. Accordingly, by detecting the difference between the first voltage signal and the second voltage signal, only the user's voice component produced near the integrated circuit device 1 remains (i.e., noise is removed). Specifically, a voltage signal (differential signal) that indicates only the user's voice component and does not contain a noise component can be obtained by detecting the difference between the first voltage signal and the second voltage signal. According to the integrated circuit device 1, a signal that indicates the user's voice from which noise is removed with high accuracy can be obtained by performing a simple process that merely generates the differential signal that indicates the difference between the two voltage signals.

However, sound waves contain a phase component. Therefore, the phase difference between the voice components and the noise components contained in the first voltage signal and the second voltage signal must be taken into consideration in order to implement a noise removal function with higher accuracy.

Specific conditions which must be satisfied by the integrated circuit device 1 in order to implement the noise removal function by generating the differential signal are described below.

(2) Specific Conditions that Must be Satisfied by Voice Input Device

According to the integrated circuit device 1, the differential signal that indicates the difference between the first voltage signal and the second voltage signal is considered to be an input voice signal that does not contain noise, as described above. According to the integrated circuit device 1, it may be considered that the noise removal function has been implemented when a noise component contained in the differential signal has become smaller than a noise component contained in the first voltage signal or the second voltage signal. Specifically, it is considered that the noise removal function has been implemented when a noise intensity ratio that indicates the ratio of the intensity of a noise component contained in the differential signal to the intensity of a noise component contained in the first voltage signal or the second voltage signal has become smaller than a voice intensity ratio that indicates the ratio of the intensity of a voice component contained in the differential signal to the intensity of a voice component contained in the first voltage signal or the second voltage signal.

Specific conditions that must be satisfied by the integrated circuit device 1 (first diaphragm 12 and second diaphragm 22) in order to implement the noise removal function are as follows.

The sound pressure of a voice that enters the first microphone 10 and the second microphone 20 (first diaphragm 12 and second diaphragm 22) is discussed below. When the distance from the sound source of the input voice (user's voice) to the first diaphragm 12 is referred to as R, the sound pressures (intensities) P(S1) and P(S2) of the input voice that enters the first microphone 10 and the second microphone 20 are expressed as follows (the phase difference is disregarded).

$$\begin{cases} P(S1) = K\dfrac{1}{R} & (2) \\ P(S2) = K\dfrac{1}{R+\Delta r} & (3) \end{cases}$$

Therefore, a voice intensity ratio ρ(P) that indicates the ratio of the intensity of the input voice component contained in the differential signal to the intensity of the input voice component obtained by the first microphone 10 is expressed as follows.

$$\rho(P) = \frac{P(S1) - P(S2)}{P(S1)} = \frac{\Delta r}{R + \Delta r} \tag{4}$$

When the integrated circuit device according to this embodiment is a microphone element utilized for a close-talking voice input device, the center-to-center distance Δr is considered to be sufficiently smaller than the distance R. Therefore, the expression (4) can be transformed as follows.

$$\rho(P) = \frac{\Delta r}{R} \tag{A}$$

Specifically, the voice intensity ratio when disregarding the phase difference of the input voice is expressed by the expression (A).

The sound pressures Q(S1) and Q(S2) of the user's voice are expressed as follows when taking the phase difference of the input voice into consideration, $$\begin{cases} Q(S1) = K\frac{1}{R}\sin\omega t & (5) \\ Q(S2) = K\frac{1}{R+\Delta r}\sin(\omega t - \alpha) & (6) \end{cases}$$

where, α is the phase difference.

The voice intensity ratio ρ(S) is then:

$$\begin{aligned} \rho(S) &= \frac{|P(S1) - P(S2)|_{max}}{|P(S1)|_{max}} \\ &= \frac{\left|\frac{K}{R}\sin\omega t - \frac{K}{R+\Delta r}\sin(\omega t - \alpha)\right|_{max}}{\left|\frac{K}{R}\sin\omega t\right|_{max}} \end{aligned} \tag{7}$$

The voice intensity ratio ρ(S) may then be expressed as follows based on the expression (7).

$$\begin{aligned} \rho(S) &= \frac{\left|\frac{K}{R}\sin\omega t - \frac{1}{1+\Delta r/R}\sin(\omega t - \alpha)\right|_{max}}{\left|\frac{K}{R}\sin\omega t\right|_{max}} \\ &= \frac{1}{1+\Delta r/R}|(1+\Delta r/R)\sin\omega t - \sin(\omega t - \alpha)|_{max} \\ &= \frac{1}{1+\Delta r/R}\left|\sin\omega t - \sin(\omega t - \alpha) + \frac{\Delta r}{R}\sin\omega t\right|_{max} \end{aligned} \tag{8}$$

In the expression (8), the term sin ωt−sin(ωt−α) indicates the phase component intensity ratio, and the term Δr/R sin ωt indicates the amplitude component intensity ratio. Since the phase difference component as the input voice component serves as noise for the amplitude component, the phase component intensity ratio must be sufficiently smaller than the amplitude component intensity ratio in order to accurately extract the input voice (user's voice). Specifically, it is necessary that sin ωt−sin(ωt−α) and Δr/R sin ωt satisfy the following relationship.

$$\left|\frac{\Delta r}{R}\sin\omega t\right|_{max} > |\sin\omega t - \sin(\omega t - \alpha)|_{max} \tag{B}$$

Since sin ωt−sin(ωt−α) is expressed as follows, $$\sin\omega t - \sin(\omega t - \alpha) = 2\sin\frac{\alpha}{2}\cdot\cos\left(\omega t - \frac{\alpha}{2}\right) \tag{9}$$

the expression (B) may then be expressed as follows.

$$\left|\frac{\Delta r}{R}\sin\omega t\right|_{max} > \left|2\sin\frac{\alpha}{2}\cdot\cos\left(\omega t - \frac{\alpha}{2}\right)\right|_{max} \tag{10}$$

Taking the amplitude component in the expression (10) into consideration, the integrated circuit device 1 according to this embodiment must satisfy the following expression.

$$\frac{\Delta r}{R} > 2\sin\frac{\alpha}{2} \tag{C}$$

Since the center-to-center distance Δr is considered to be sufficiently smaller than the distance R, sin(α/2) can be considered to be sufficiently small and approximated as follows.

$$\sin\frac{\alpha}{2} \approx \frac{\alpha}{2} \tag{11}$$

Therefore, the expression (C) can be transformed as follows.

$$\frac{\Delta r}{R} > \alpha \tag{D}$$

When the relationship between the phase difference α and the center-to-center distance Δr is expressed as follows, $$\alpha = \frac{2\pi\Delta r}{\lambda} \tag{12}$$

the expression (D) can be transformed as follows.

$$\frac{\Delta r}{R} > 2\pi\frac{\Delta r}{\lambda} > \frac{\Delta r}{\lambda} \tag{E}$$

Specifically, the integrated circuit device 1 according to this embodiment must satisfy the relationship shown by the expression (E) in order to accurately extract the input voice (user's voice).

The sound pressure of noise that enters the first microphone 10 and the second microphone 20 (first diaphragm 12 and second diaphragm 22) is discussed below.

When the amplitudes of noise components obtained by the first microphone 10 and the second microphone 20 are referred to as A and A', sound pressures Q(N1) and Q(N2) of noise are expressed as follows when taking a phase difference component into consideration.

$$\begin{cases} Q(N1) = A\sin\omega t & (13) \\ Q(N2) = A'\sin(\omega t - \alpha) & (14) \end{cases}$$

A noise intensity ratio ρ(N) that indicates the ratio of the intensity of the noise component contained in the differential signal to the intensity of the noise component obtained by the first microphone 10 is expressed as follows.

$$\rho(N)=\frac{|Q(N1)-Q(N2)|_{max}}{|Q(N1)|_{max}}=\frac{|A\sin\omega t-A'\sin(\omega t-\alpha)|_{max}}{|A\sin\omega t|_{max}} \quad (15)$$

The amplitudes (intensities) of noise components obtained by the first microphone 10 and the second microphone 20 are almost the same (i.e., A=A'), as described above. Therefore, the expression (15) can be transformed as follows.

$$\rho(N)=\frac{|\sin\omega t-\sin(\omega t-\alpha)|_{max}}{|\sin\omega t|_{max}} \quad (16)$$

The noise intensity ratio is expressed as follows.

$$\rho(N)=\frac{|\sin\omega t-\sin(\omega t-\alpha)|_{max}}{|\sin\omega t|_{max}}=|\sin\omega t-\sin(\omega t-\alpha)|_{max} \quad (17)$$

The expression (17) can be transformed as follows based on the expression (9).

$$\rho(N)=\left|\cos\left(\omega t-\frac{\alpha}{2}\right)\right|_{max}\cdot 2\sin\frac{\alpha}{2}=2\sin\frac{\alpha}{2} \quad (18)$$

The expression (18) can be transformed as follows based on the expression (11).

$$\rho(N)=\alpha \quad (19)$$

The noise intensity ratio is expressed as follows based on the expression (D).

$$\rho(N)=\alpha<\frac{\Delta r}{R} \quad (F)$$

Note that Δr/R indicates the amplitude component intensity ratio of the input voice (user's voice), as indicated by the expression (A). In the integrated circuit device 1, the noise intensity ratio is smaller than the input voice intensity ratio Δr/R, as is clear from the expression (F).

According to the integrated circuit device 1 in which the phase component intensity ratio of the input voice is smaller than the amplitude component intensity ratio (see the expression (B)), the noise intensity ratio is smaller than the input voice intensity ratio (see the expression (F)). In other words, the integrated circuit device 1 designed so that the noise intensity ratio is smaller than the input voice intensity ratio can implement a highly accurate noise removal function.

3. Method of Producing Integrated Circuit Device

A method of producing the integrated circuit device according to this embodiment is described below. In this embodiment, the integrated circuit device may be produced utilizing data that indicates the relationship between the noise intensity ratio (intensity ratio based on the noise phase component) and the ratio Δr/λ that indicates the ratio of the center-to-center distance Δr between the first diaphragm 12 and the second diaphragm 22 to a wavelength λ of noise.

The intensity ratio based on the noise phase component is expressed by the expression (18). Therefore, the decibel value of the intensity ratio based on the noise phase component is expressed as follows.

$$20\log\rho(N)=20\log\left|2\sin\frac{\alpha}{2}\right| \quad (20)$$

Figure 5:
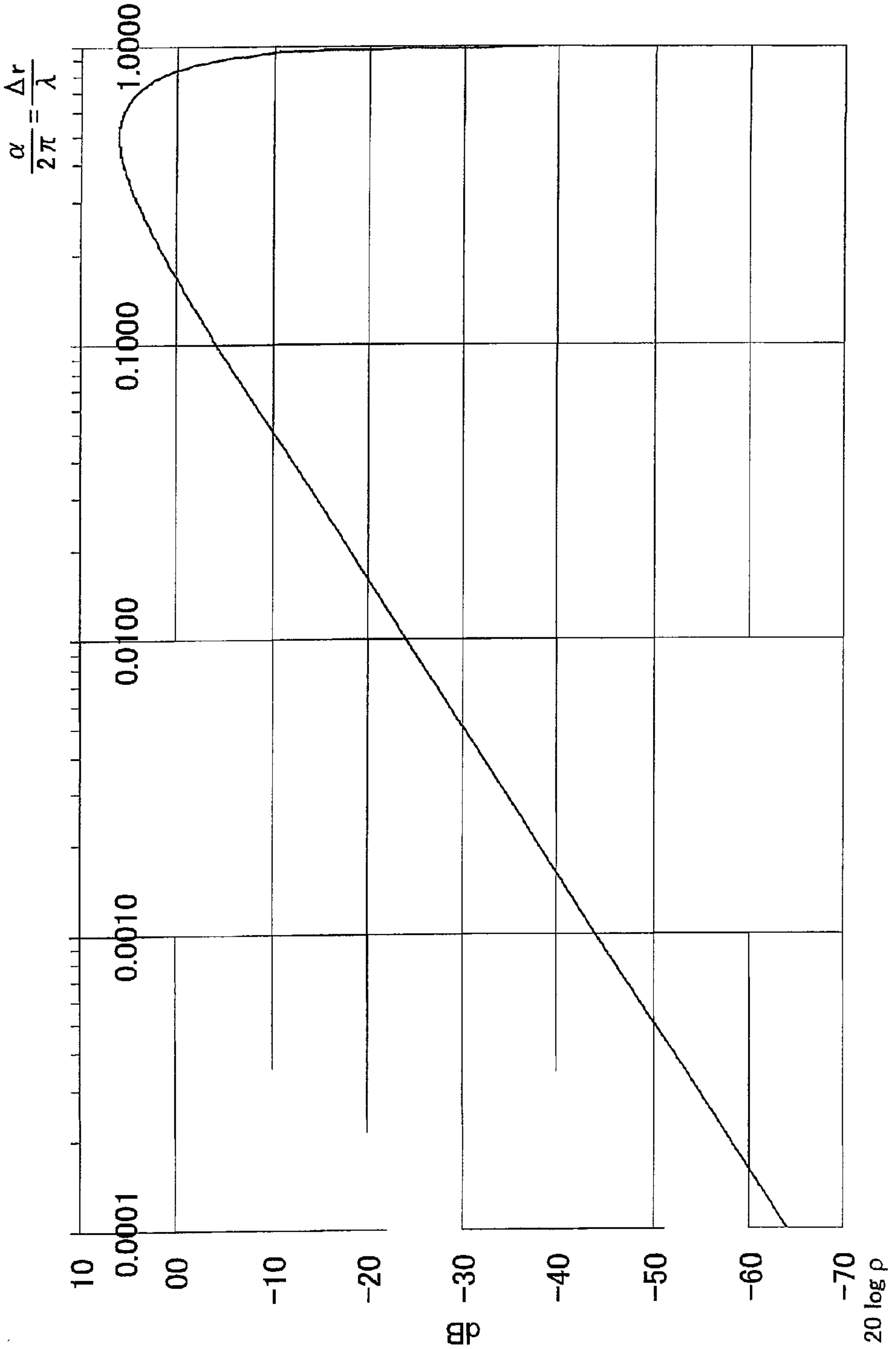
FIG. 5 illustrates a method of producing an integrated circuit device.

The relationship between the phase difference α and the intensity ratio based on the phase component of noise can be determined by substituting each value for α in the expression (20). FIG. 5 illustrates an example of data that indicates the relationship between the phase difference and the intensity ratio wherein the horizontal axis indicates α/2π and the vertical axis indicates the intensity ratio (decibel value) based on the noise phase component.

The phase difference α can be expressed as a function of the ratio Δr/λ that indicates the ratio of the distance Δr to the wavelength λ, as indicated by the expression (12). Therefore, the vertical axis in FIG. 5 is considered to indicate the ratio Δr/λ. Specifically, FIG. 5 illustrates data that indicates the relationship between the intensity ratio based on the phase component of noise and the ratio Δr/λ.

Figure 6:
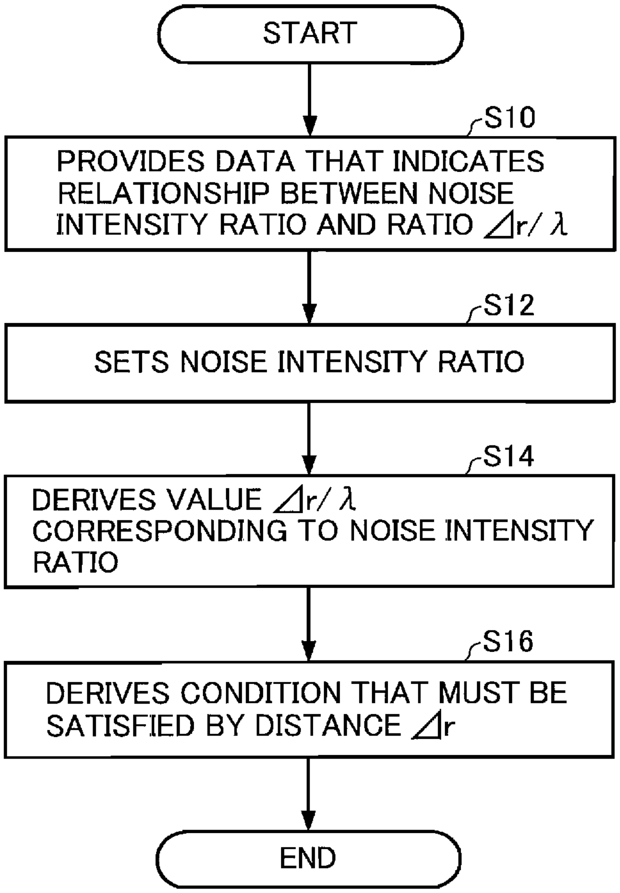
FIG. 6 illustrates a method of producing an integrated circuit device.

In this embodiment, the integrated circuit device 1 is produced utilizing the above-mentioned data. FIG. 6 is a flowchart illustrating a process of producing the integrated circuit device 1 utilizing the above-mentioned data.

First, data that indicates the relationship between the noise intensity ratio (intensity ratio based on the phase component of noise) and the ratio Δr/λ (refer to FIG. 5) is provided (step S10).

The noise intensity ratio is set corresponding to the application (step S12). In this embodiment, the noise intensity ratio must be set so that the noise intensity decreases. Therefore, the noise intensity ratio is set to be 0 dB or less in this step.

A value Δr/λ corresponding to the noise intensity ratio is derived based on the data (step S14).

A condition that must be satisfied by the distance Δr is derived by substituting the wavelength of the main noise for λ (step S16).

A specific example in which the frequency of the main noise is 1 KHz and an integrated circuit device that reduces the intensity of the noise by 20 dB is produced in an environment in which the wavelength of the noise is 0.347 m is discussed below.

A condition necessary for the noise intensity ratio to become 0 dB or less is as follows. As illustrated in FIG. 5, the noise intensity ratio can be set at 0 dB or less by setting the value Δr/λ at 0.16 or less. Specifically, the noise intensity ratio can be set at 0 dB or less by setting the distance Δr at 55.46 mm or less. This is a necessary condition for the integrated circuit device.

A condition necessary for reducing the intensity of noise having a frequency of 1 KHz by 20 dB is as follows. As illustrated in FIG. 5, the intensity of noise can be reduced by 20 dB by setting the value Δr/λ at 0.015. When λ=0.347 m, this condition is satisfied when the distance Δr is 5.20 mm or less. Specifically, an integrated circuit device having a noise removal function can be produced by setting the distance Δr at about 5.2 mm or less.

Since the integrated circuit device 1 according to this embodiment is utilized for a close-talking voice input device, the distance between the sound source of the user's voice and the integrated circuit device 1 (first diaphragm 12 or second diaphragm 22) is normally 5 cm or less. The distance between the sound source of the user's voice and the integrated circuit device 1 (first diaphragm 12 and second diaphragm 22) can be controlled by changing the design of a housing. Therefore, the intensity ratio $\Delta r/R$ of the input voice (user's voice) becomes larger than 0.1 (noise intensity ratio) so that the noise removal function is implemented.

Note that noise is not normally limited to a single frequency. However, since the wavelength of noise having a frequency lower than that of noise considered to be the main noise is longer than that of the main noise, the value $\Delta r/\lambda$ decreases so that the noise is removed by the integrated circuit device. On the other hand, the energy of sound waves is attenuated more quickly as the frequency becomes higher. Therefore, since the energy of noise having a frequency higher than that of noise considered to be the main noise is attenuated more quickly than that of the main noise, the effect of the noise on the integrated circuit device can be disregarded. Therefore, the integrated circuit device according to this embodiment exhibits an excellent noise removal function even in an environment in which noise having a frequency differing from that of noise considered to be the main noise is present.

This embodiment has been described taking an example in which noise enters along a straight line that connects the first diaphragm 12 and the second diaphragm 22, as indicated by the expression (12). In this case, the apparent distance between the first diaphragm 12 and the second diaphragm 22 becomes a maximum, and the noise has the largest phase difference in an actual usage environment. Specifically, the integrated circuit device 1 according to this embodiment is configured to be able to remove noise having the largest phase difference. Therefore, the integrated circuit device 1 according to this embodiment can remove noise that enters from all directions.

4. Effects

The effects of the integrated circuit device 1 are summarized as follows.

As described above, the integrated circuit device 1 can obtain a voice component from which noise has been removed by merely generating the differential signal that indicates the difference between the voltage signals obtained by the first microphone 10 and the second microphone 20. Specifically, the voice input device can implement a noise removal function without performing a complex analytical calculation process. Therefore, an integrated circuit device (microphone element or voice input element) that can implement a highly accurate noise removal function by a simple configuration can be provided.

According to the integrated circuit device 1, the first diaphragm 12 and the second diaphragm 22 are disposed such that noise incident on the first diaphragm 12 and the second diaphragm 22 so that the noise intensity ratio based on the phase difference becomes a maximum can be removed. Therefore, the integrated circuit device 1 can remove noise that enters from all directions. Specifically, the invention can provide an integrated circuit device that can remove noise that enters from all directions.

The integrated circuit device 1 can also remove the user's voice component that enters the integrated circuit device 1 after being reflected by a wall or the like. Specifically, since a user's voice reflected by a wall or the like enters the integrated circuit device 1 after traveling over a long distance, such a user's voice can be considered to be produced from a sound source positioned away from the integrated circuit device 1 as compared with a normal user's voice. Moreover, since the energy of such a user's voice has been reduced to a large extent due to reflection, the sound pressure is not attenuated to a large extent between the first diaphragm 12 and the second diaphragm 22 in the same manner as a noise component. Therefore, the integrated circuit device 1 also removes a user's voice component that enters the integrated circuit device 1 after being reflected by a wall or the like in the same manner as noise (as one type of noise).

In the integrated circuit device 1, the first diaphragm 12, the second diaphragm 22, and the differential signal generation circuit 30 are formed on the single semiconductor substrate 100. According to this configuration, the first diaphragm 12 and the second diaphragm 22 can be accurately formed while significantly reducing the center-to-center distance between the first diaphragm 12 and the second diaphragm 22. Therefore, an integrated circuit device having a small size and a high noise removal accuracy can be provided.

A signal that indicates the input voice and does not contain noise can be obtained by utilizing the integrated circuit device 1. Therefore, a highly accurate speech (voice) recognition process, voice authentication process, and command generation process can be implemented by utilizing the integrated circuit device 1.

5. Voice Input Device

A voice input device 1 that includes the integrated circuit device 1 is described below.

(1) Configuration of Voice Input Device

Figure 7:
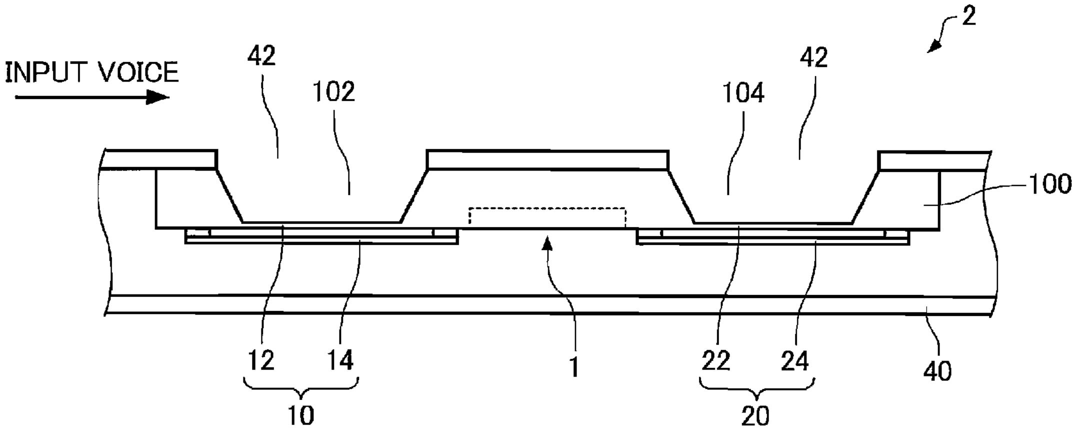
FIG. 7 illustrates a voice input device that includes an integrated circuit device.
Figure 8:
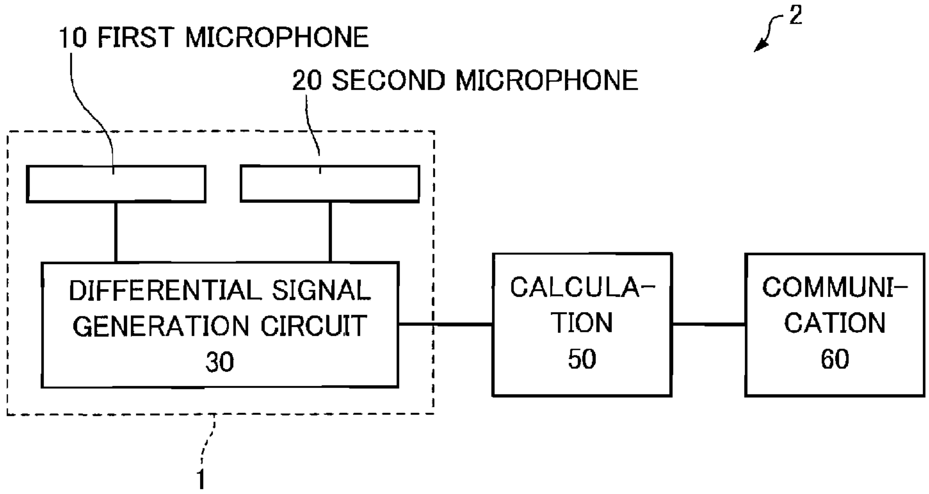
FIG. 8 illustrates a voice input device that includes an integrated circuit device.

The voice input device 2 has the following configuration. FIGS. 7 and 8 respectively illustrate the configuration of the voice input device 2. The voice input device 2 is a close-talking voice input device, and may be applied to voice communication instruments (e.g., portable telephone and transceiver), information processing systems utilizing input voice analysis technology (e.g., voice authentication system, voice recognition system, command generation system, electronic dictionary, translation device, and voice input remote controller), recording instruments, amplifier systems (loudspeaker), microphone systems, and the like.

FIG. 7 illustrates the structure of the voice input device 2.

The voice input device 2 includes a housing 40. The housing 40 may be a member that defines the external shape of the voice input device 2. A basic position may be set for the housing 40. This makes it possible to limit the travel path of the input voice (user's voice). The housing 40 may have openings 42 for receiving the input voice (user's voice).

In the voice input device 2, the integrated circuit device 1 is disposed in the housing 40. The integrated circuit device 1 may be disposed in the housing 40 so that the first depression 102 and the second depression 104 communicate with the openings 42. The integrated circuit device 1 may be disposed in the housing 40 so that the first diaphragm 12 and the second diaphragm 22 are shifted along the travel path of the input voice. The first diaphragm 12 may be disposed on the upstream side of the travel path of the input voice, and the second diaphragm 22 may be disposed on the downstream side of the travel path of the input voice.

The function of the voice input device 2 is described below with reference to FIG. 8. FIG. 8 is a block diagram illustrating the function of the voice input device 2.

The voice input device 2 includes the first microphone 10 and the second microphone 20. The first microphone 10 and the second microphone 20 output the first voltage signal and the second voltage signal, respectively.

The voice input device 2 includes the differential signal generation circuit 30. The differential signal generation circuit 30 receives the first voltage signal and the second voltage signal respectively output from the first microphone 10 and the second microphone 20, and generates the differential signal that indicates the difference between the first voltage signal and the second voltage signal.

The first microphone 10, the second microphone 20, and the differential signal generation circuit 30 are implemented by the single semiconductor substrate 100.

The voice input device 2 may include a calculation section 50. The calculation section 50 performs various calculation processes based on the differential signal generated by the differential signal generation circuit 30. The calculation section 50 may analyze the differential signal. The calculation section 50 may specify a person who has produced the input voice by analyzing the differential signal (i.e., voice authentication process). The calculation section 50 may specify the content of the input voice by analyzing the differential signal (i.e., voice recognition process). The calculation section 50 may create various commands based on the input voice. The calculation section 50 may amplify (i.e., increase or decrease) the differential signal by a predetermined gain. The calculation section 50 may control the operation of a communication section 60 described later. The calculation section 50 may implement the above-mentioned functions by signal processing using a CPU and a memory.

The voice input device 2 may further include the communication section 60. The communication section 60 controls communication between the voice input device and another terminal (e.g., portable telephone terminal or host computer). The communication section 60 may transmit a signal (differential signal) to another terminal through a network. The communication section 60 may receive a signal from another terminal through a network. A host computer may analyze the differential signal acquired through the communication section 60, and perform various types of information processing such as a voice recognition process, a voice authentication process, a command generation process, and a data storage process. Specifically, the voice input device may form an information processing system together with another terminal. In other words, the voice input device may be considered to be an information input terminal that forms an information processing system. Note that the voice input device may not include the communication section 60.

The calculation section 50 and the communication section 60 may be disposed in the housing 40 as a packaged semiconductor device (integrated circuit device). Note that the invention is not limited thereto. For example, the calculation section 50 may be disposed outside the housing 40. When the calculation section 50 is disposed outside the housing 40, the calculation section 50 may acquire the differential signal through the communication section 60.

The voice input device 2 may further include a display device such as a display panel and a sound output device such as a loudspeaker. The voice input device according to this embodiment may further include an operation key that allows the user to input operation information.

The voice input device 2 may be configured as described above. The voice input device 2 utilizes the integrated circuit device 1 as a microphone element (voice input element). Therefore, the voice input device 2 can obtain a signal that indicates the input voice and does not contain noise, and can implement a highly accurate speech recognition process, voice authentication process, and command generation process.

When applying the voice input device 2 to a microphone system, the user's voice output from a loudspeaker is also removed as noise. Therefore, a microphone system that rarely howls can be provided.

6. Modification

A modification of the embodiment to which the invention is applied is described below.

Figure 9:
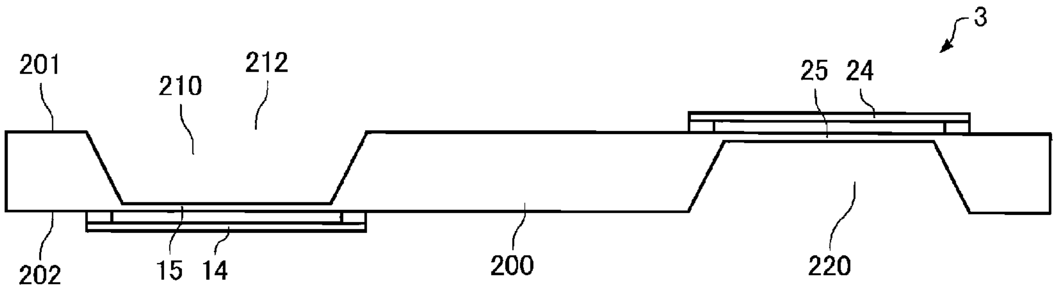
FIG. 9 illustrates a modification of the integrated circuit device.

FIG. 9 illustrates another integrated circuit device 3 according to this embodiment.

As illustrated in FIG. 9, the integrated circuit device 3 according to this embodiment includes a semiconductor substrate 200. A first diaphragm 15 and a second diaphragm 25 are formed on the semiconductor substrate 200. The first diaphragm 15 forms the bottom of a first depression 210 formed in a first side 201 of the semiconductor substrate 200. The second diaphragm 25 forms the bottom of a second depression 220 formed in a second side 202 (side opposite to the first side 201) of the semiconductor substrate 200. In the integrated circuit device 3 (semiconductor substrate 200), the first diaphragm 15 and the second diaphragm 25 are disposed at different positions in the normal direction (i.e., the direction of the thickness of the semiconductor substrate 200). The first diaphragm 15 and the second diaphragm 25 may be disposed on the semiconductor substrate 200 so that the distance between the first diaphragm 15 and the second diaphragm 25 along the normal direction is 5.2 mm or less. Alternatively, the first diaphragm 15 and the second diaphragm 25 may be disposed so that the center-to-center distance between the first diaphragm 15 and the second diaphragm 25 is 5.2 mm or less.

Figure 10:
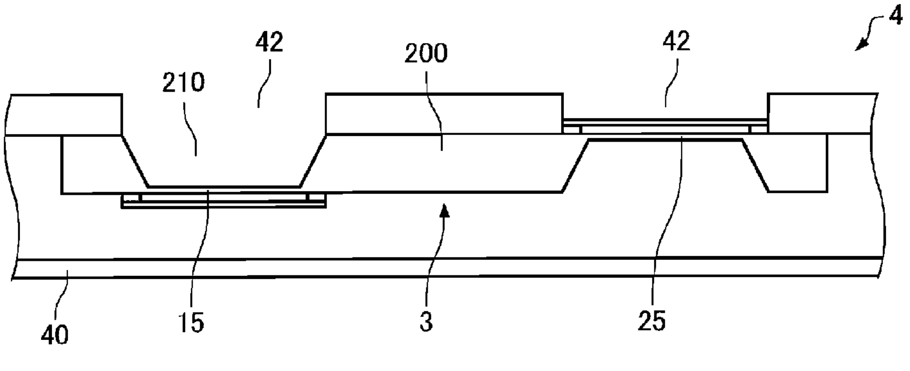
FIG. 10 illustrates a modification of the voice input device that includes an integrated circuit device.

FIG. 10 illustrates a voice input device 4 that includes the integrated circuit device 3. The integrated circuit device 3 is disposed in a housing 40. As illustrated in FIG. 10, the integrated circuit device 1003 may be disposed in the housing 40 so that the first side 201 faces the side of the housing 40 in which openings 42 are formed. The integrated circuit device 3 may be disposed in the housing 40 so that the first depression 210 communicates with the opening 42 and the second diaphragm 25 overlaps the opening 42.

In this embodiment, the integrated circuit device 3 may be disposed so that the center of an opening 212 that communicates with the first depression 210 is disposed at a position closer to the input voice source than the center of the second diaphragm 25 (i.e., the bottom of the second depression 220). The integrated circuit device 3 may be disposed so that the input voice reaches the first diaphragm 15 and the second diaphragm 25 at the same time. For example, the integrated circuit device 3 may be disposed so that the distance between the input voice source (model sound source) and the first diaphragm 15 is equal to the distance between the model sound source and the second diaphragm 25. The integrated circuit device 3 may be disposed in the housing of which the basic position is set so that the above-mentioned conditions are satisfied.

The voice input device according to this embodiment can reduce the difference in incidence time between the input voice (user's voice) incident on the first diaphragm 15 and the input voice (user's voice) incident on the second diaphragm 25. Therefore, since the differential signal can be generated so that the differential signal does not contain the phase difference component of the input voice, the amplitude component of the input voice can be accurately extracted.

Since sound waves are not diffused inside the depression (first depression 210), the amplitude of the sound waves is attenuated to only small extent. Therefore, the intensity (amplitude) of the input voice that causes the first diaphragm 15 to vibrate is considered to be the same as the intensity of the input voice in the opening 212. Accordingly, even if the voice input device is configured so that the input voice reaches the first diaphragm 15 and the second diaphragm 25 at the same time, the input voice that causes the first diaphragm 15 to vibrate differs in intensity from the input voice that causes the second diaphragm 25 to vibrate. As a result, the input voice can be extracted by obtaining the differential signal that indicates the difference between the first voltage signal and the second voltage signal.

In summary, the voice input device can acquire the amplitude component (differential signal) of the input voice so that noise based on the phase difference component of the input voice is excluded. This makes it possible to implement a highly accurate noise removal function.

Figure 11:
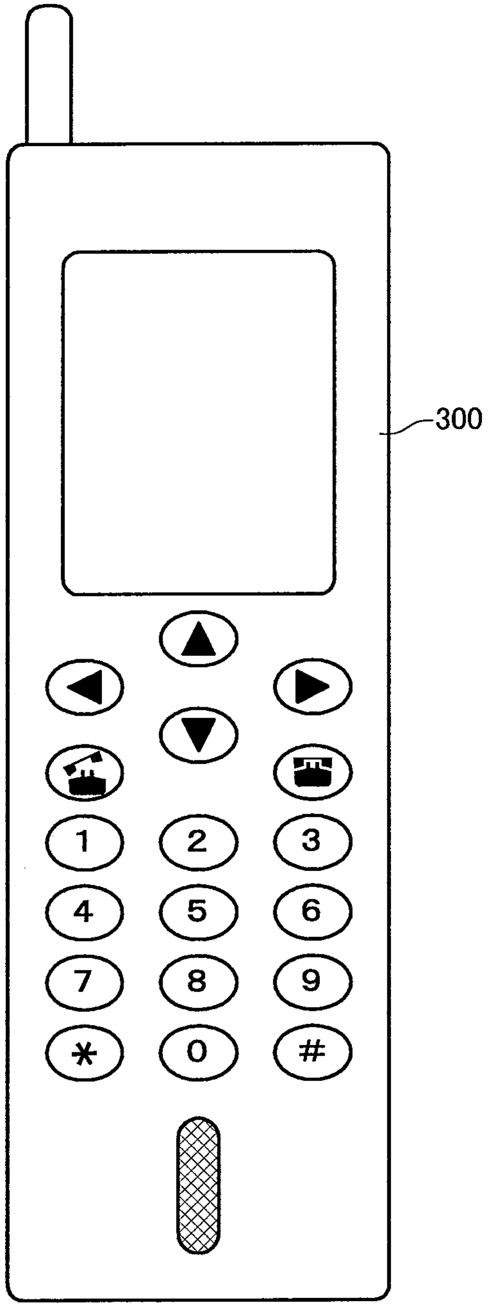
FIG. 11 illustrates a portable telephone as an example of a voice input device that includes an integrated circuit device.
Figure 12:
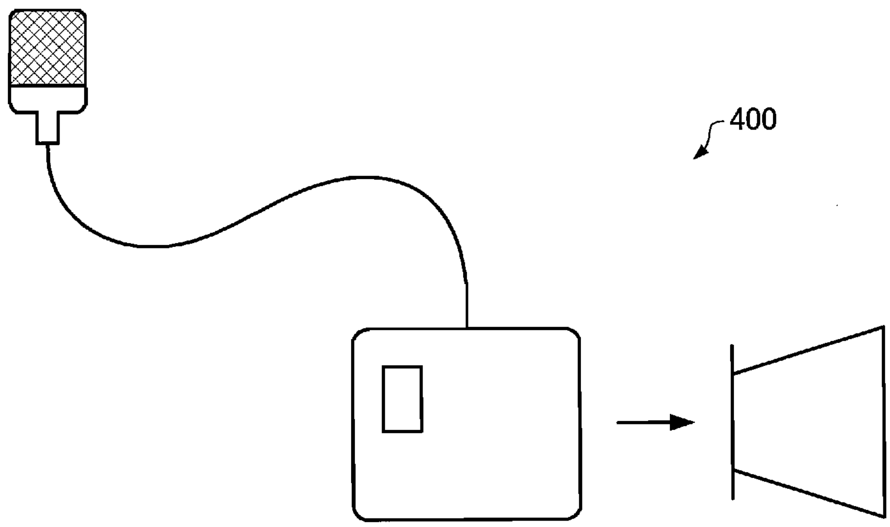
FIG. 12 illustrates a microphone as an example of a voice input device that includes an integrated circuit device.
Figure 13:
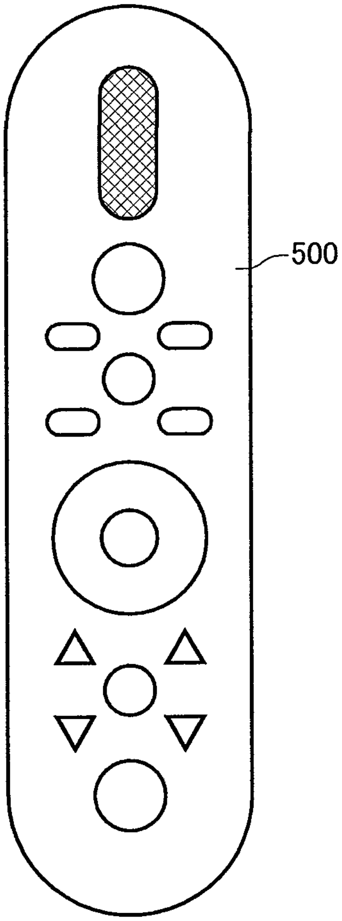
FIG. 13 illustrates a remote controller as an example of a voice input device that includes an integrated circuit device.
Figure 14:
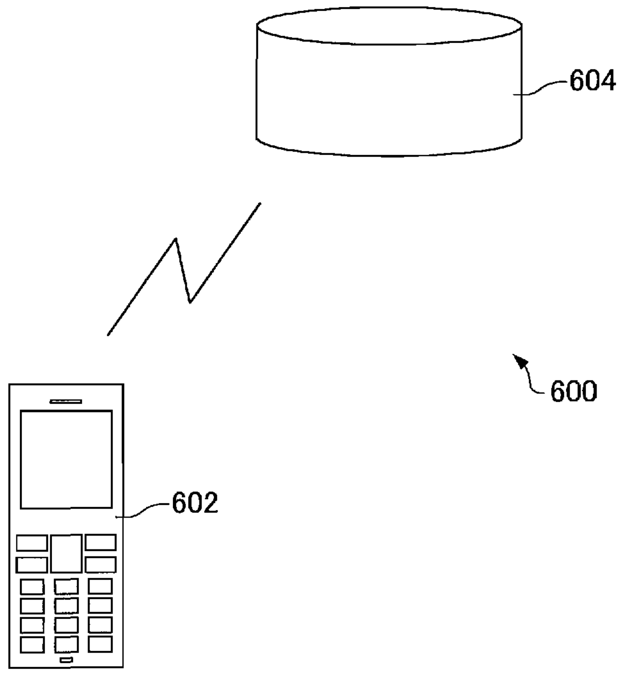
FIG. 14 schematically illustrates an information processing system.

FIGS. 11 to 13 respectively illustrate a portable telephone 300, a microphone (microphone system) 400, and a remote controller 500 as examples of the voice input device according to the embodiment of the invention. FIG. 14 is a schematic view of an information processing system 600 which includes a voice input device 602 as an information input terminal and a host computer 604.

7. Configuration of Integrated Circuit Device

The above embodiments have been described taking an example in which the first diaphragm that forms the first microphone, the second diaphragm that forms the second microphone, and the differential signal generation circuit are formed on the semiconductor substrate. Note that the invention is not limited thereto. The invention encompasses an integrated circuit device that includes a circuit board that includes a first diaphragm that forms a first microphone, a second diaphragm that forms a second microphone, and a differential signal generation circuit that receives a first voltage signal obtained by the first microphone and a second voltage signal obtained by the second microphone, and generates a differential signal that indicates the difference between the first voltage signal and the second voltage signal. The first diaphragm, the second diaphragm, and the differential signal generation circuit may be formed in the circuit board, or may be mounted on the circuit board by flip-chip mounting or the like.

The circuit board may be a semiconductor substrate, another circuit board (e.g., glass epoxy circuit board), or the like.

The difference in characteristics between the microphones due to an environment (e.g., temperature) can be suppressed by forming the first diaphragm and the second diaphragm on a single circuit board. The differential signal generation circuit may have a function of adjusting the gain balance between the microphones. Therefore, a variation in gain of the microphones can be adjusted corresponding to each circuit board before shipment.

Figure 15:
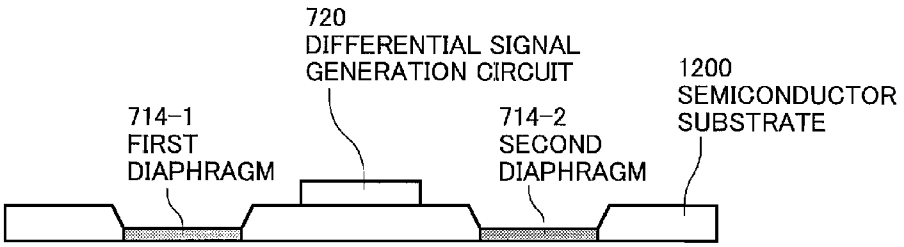
FIG. 15 illustrates another configuration of an integrated circuit device.
Figure 16:
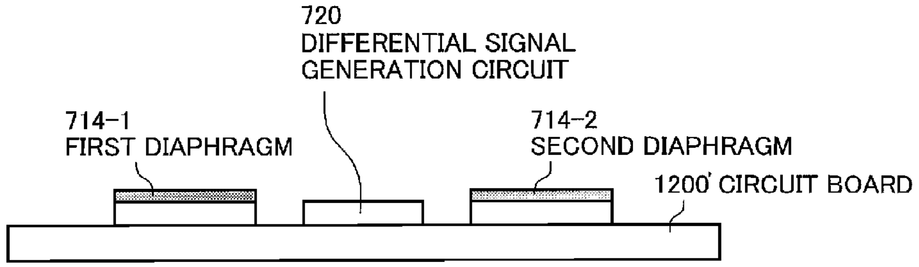
FIG. 16 illustrates still another configuration of an integrated circuit device.
Figure 17:
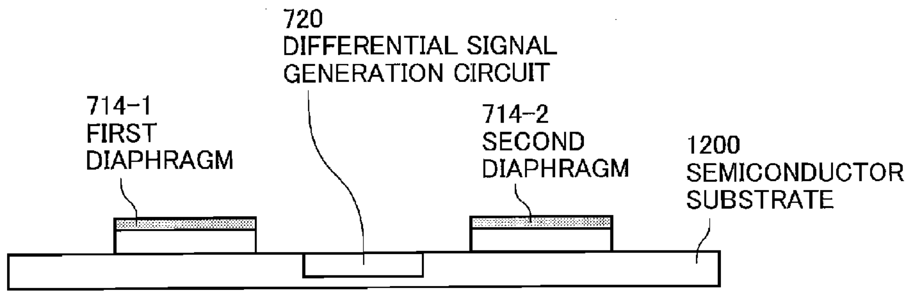
FIG. 17 illustrates a further configuration of an integrated circuit device.

FIGS. 15 to 17 illustrate other configurations of the integrated circuit device according to this embodiment.

In the integrated circuit device according to this embodiment illustrated in FIG. 15, the circuit board is a semiconductor substrate 1200, a first diaphragm 714-1 and a second diaphragm 714-2 are formed on the semiconductor substrate 1200, and a differential signal generation circuit 720 is flip-chip mounted on the semiconductor substrate 1200.

The term "flip-chip mounting" refers to a mounting method that directly and electrically connects an integrated circuit (IC) element or an IC chip to a substrate in a state in which the circuit surface of the IC element or IC chip faces the substrate. When utilizing flip-chip mounting, the surface of the chip is electrically connected to the substrate through protruding terminals (bumps) that are arranged in an array instead of wire-bonding the surface of the chip to the substrate. Therefore, the mounting area can be reduced as compared with wire bonding.

The difference in characteristics between the microphones due to an environment (e.g., temperature) can be suppressed by forming the first diaphragm 714-1 and second diaphragm 714-2 on the single semiconductor substrate 1200.

In the integrated circuit device according to this embodiment illustrated in FIG. 16, the first diaphragm 714-1, the second diaphragm 714-2, and the differential signal generation circuit 720 are flip-chip mounted on a circuit board 1200'. The circuit board 1200' may be a semiconductor substrate, another circuit board (e.g., glass epoxy circuit board), or the like.

In the integrated circuit device according to this embodiment illustrated in FIG. 17, the circuit board is the semiconductor substrate 1200, the differential signal generation circuit 720 is formed on the semiconductor substrate 1200, and the first diaphragm 714-1 and the second diaphragm 714-2 are flip-chip mounted on the semiconductor substrate 1200.

Figure 18:
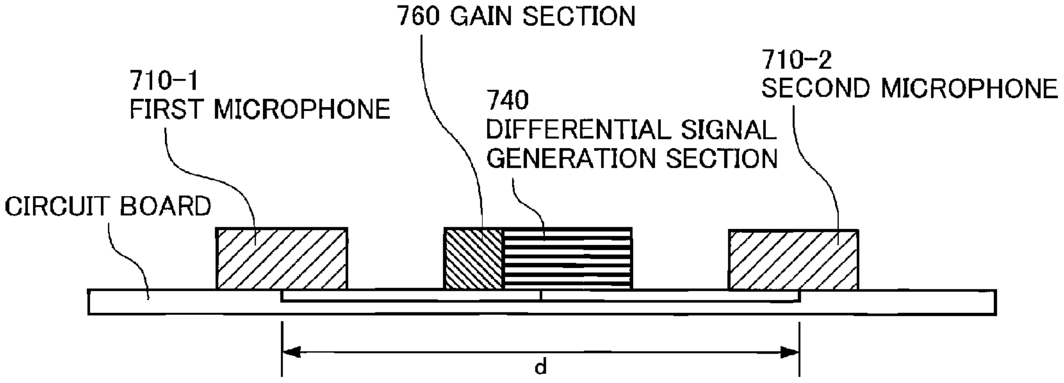
FIG. 18 illustrates an example of configuration of an integrated circuit device.
Figure 19:
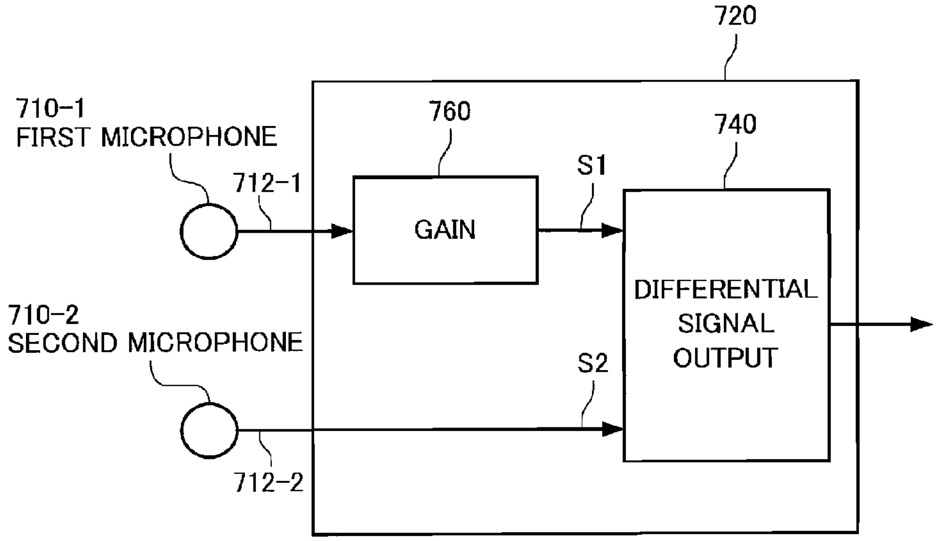
FIG. 19 illustrates an example of configuration of an integrated circuit device.

FIGS. 18 and 19 respectively illustrate an example of configuration of the integrated circuit device according to this embodiment.

An integrated circuit device according 700 according to this embodiment includes the first microphone 710-1 that includes the first diaphragm. The integrated circuit device 700 according to this embodiment also includes the second microphone 710-2 that includes the second diaphragm.

The first diaphragm of the first microphone 710-1 and the first diaphragm of the second microphone 710-2 are disposed so that a noise intensity ratio that indicates the ratio of the intensity of a noise component contained in a differential signal 742 to the intensity of the noise component contained in a first voltage signal 712-1 or a second voltage signal 712-2, is smaller than an input voice intensity ratio that indicates the ratio of the intensity of an input voice component contained in the differential signal 742 to the intensity of the input voice component contained in the first voltage signal 712-1 or the second voltage signal 712-2.

The integrated circuit device 700 according to this embodiment includes the differential signal generation section 720 that generates the differential signal 742 that indicates the difference between the first voltage signal 712-1 obtained by the first microphone 710-1 and the second voltage signal 712-2 obtained by the second microphone 710-2, based on the first voltage signal 712-1 and the second voltage signal 712-2.

The differential signal generation section 720 includes a gain section 760. The gain section 760 amplifies the first voltage signal obtained by the first microphone 710-1 by a predetermined gain, and outputs the resulting signal.

The differential signal generation section 720 includes a differential signal output section 740. The differential signal output section 740 receives a first voltage signal S1 amplified by the gain section 760 by a predetermined gain and the second voltage signal S2 obtained by the second microphone, generates a differential signal that indicates the difference between the first voltage signal S1 and the second voltage signal S2, and outputs the differential signal.

Since the first voltage signal and the second voltage signal can be corrected by amplifying the first voltage signal 712-1 by a predetermined gain so that the difference in amplitude between the first voltage signal and the second voltage signal due to the difference in sensitivity between the microphones is canceled, a deterioration in noise reduction effect can be prevented.

Figure 20:
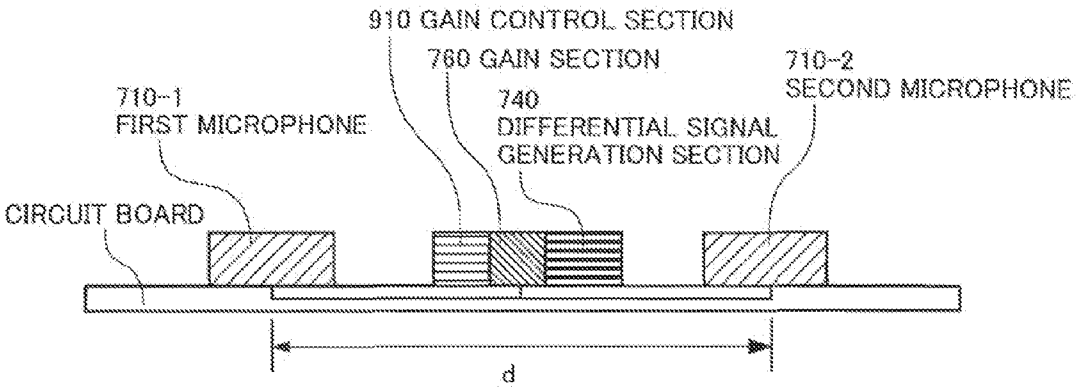
FIG. 20 illustrates an example of configuration of an integrated circuit device.
Figure 21:
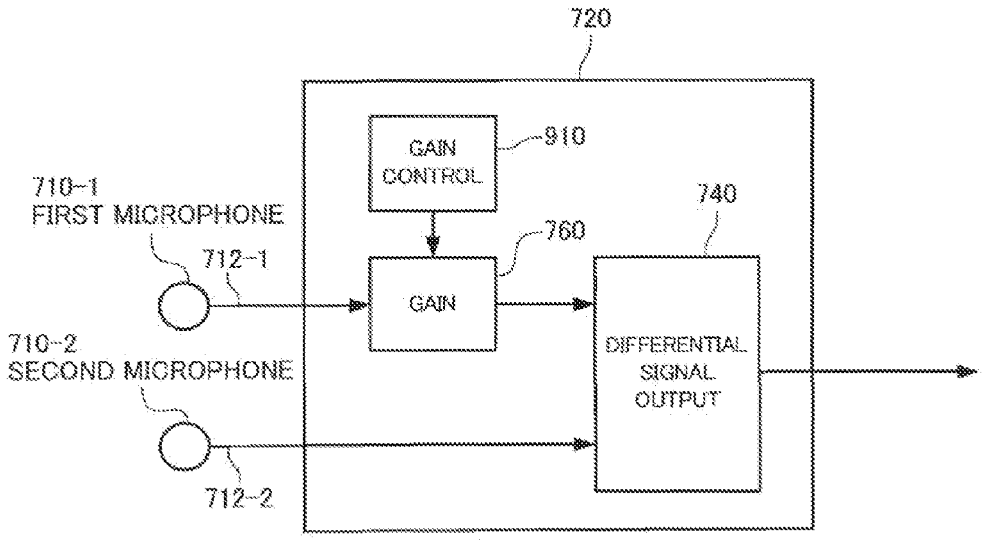
FIG. 21 illustrates an example of configuration of an integrated circuit device.

FIGS. 20 and 21 respectively illustrate an example of another configuration of the integrated circuit device according to this embodiment.

The differential signal generation section 720 according to this embodiment may include a gain control section 910. The gain control section 910 changes the gain of the gain section 760. The balance between the amplitude of the output S1 from the gain section and the amplitude of the second voltage signal 712-2 obtained by the second microphone may be adjusted by causing the gain control section 910 to dynamically or statically control the gain of the gain section 760.

Figure 22:
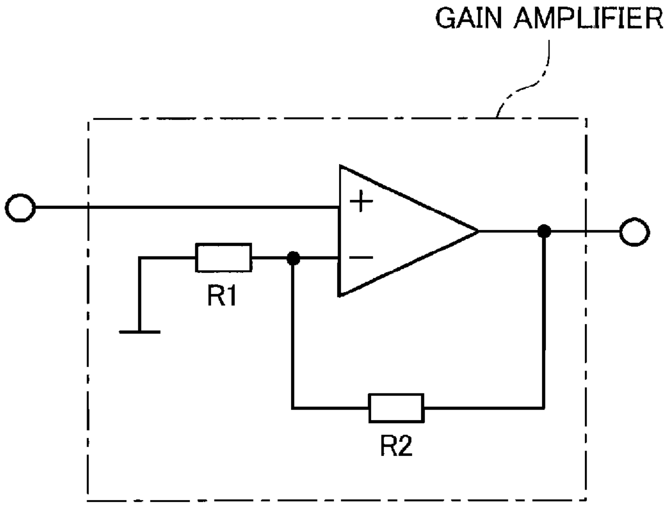
FIG. 22 illustrates an example of configuration of a gain section and a gain control section.

FIG. 22 illustrates an example of a specific configuration of the gain section and the gain control section. When processing an analog signal, for example, the gain section 760 may be formed by an analog circuit such as an operational amplifier (e.g., a noninverting amplifier circuit in FIG. 22). The amplification factor of the operational amplifier may be controlled by dynamic or statically controlling the voltage applied to the inverting (–) terminal of the operational amplifier by changing the resistances of resistors R1 and R2 or setting the resistances of the resistors R1 and R2 at predetermined values during production.

Figure 23A:
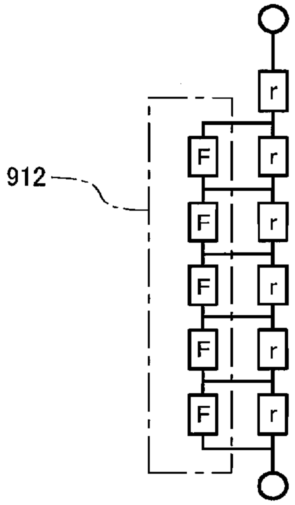
FIG. 23A illustrates an example of configuration that statically controls an amplification factor of a gain section.
Figure 23B:
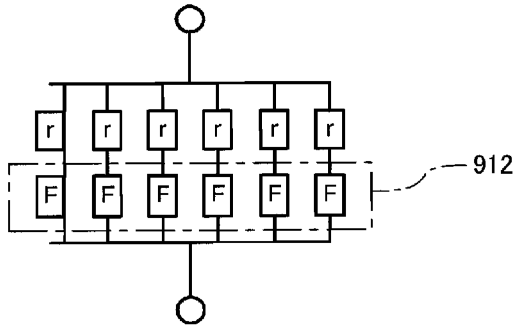
FIG. 23B illustrates an example of configuration that statically controls an amplification factor of a gain section.

FIGS. 23A and 23B respectively illustrate an example of a configuration that statically controls the amplification factor of the gain section.

As illustrated in FIG. 23A, the resistor R1 or R2 in FIG. 22 may include a resistor array in which a plurality of resistors are connected in series, and a predetermined voltage may be applied to a predetermined terminal (the inverting (–) terminal in FIG. 22) of the gain section through the resistor array, for example. The resistors or conductors (F indicated by 912) that form the resistor array may be cut using a laser or fused by applying a high voltage or a high current during the production process so that the resistors have a resistance that implements an appropriate amplification factor.

As illustrated in FIG. 23B, the resistor R1 or R2 in FIG. 32 may include a resistor array in which a plurality of resistors are connected in parallel, and a predetermined voltage may be applied to a predetermined terminal (the inverting (–) terminal in FIG. 22) of the gain section through the resistor array, for example. The resistors or conductors (F indicated by 912) that form the resistor array may be cut using a laser or fused by applying a high voltage or a high current during the production process so that the resistors have a resistance that implements an appropriate amplification factor.

The amplification factor may be set at a value that cancels the gain balance of the microphone that has occurred during the production process. A resistance corresponding to the gain balance of the microphone that has occurred during the production process can be achieved by utilizing the resistor array in which a plurality of resistors are connected in series or parallel (see FIGS. 23A and 23B), so that the gain control section that is connected to the predetermined terminal supplies a current that controls the gain of the gain section.

This embodiment has been described taking an example in which a plurality of resistors (r) are connected through fuses (F). Note that the invention is not limited thereto. For example, a plurality of resistors (r) may be connected in series or parallel without using the fuses (F). In this case, at least one resistor may be cut.

Figure 25:
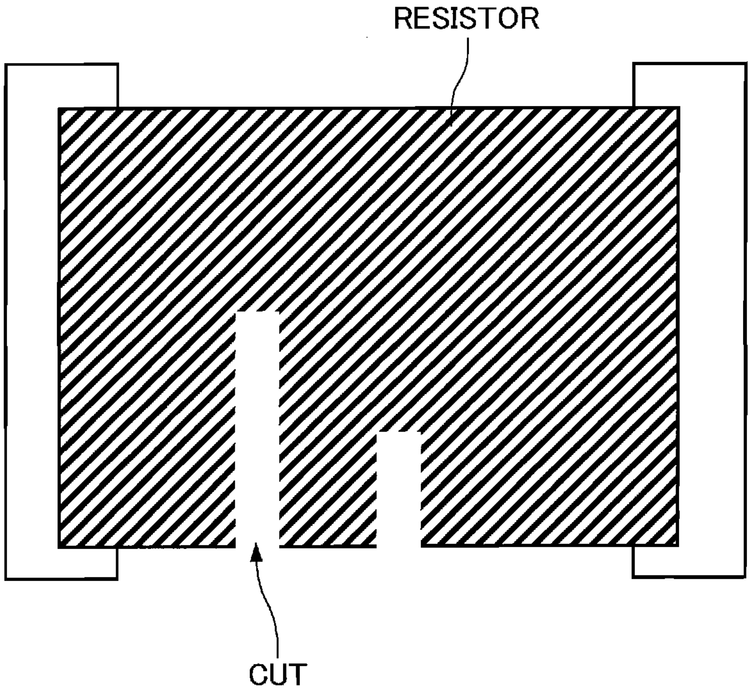
FIG. 25 illustrates an example of adjustment of a resistance by laser trimming.

Alternatively, the resistor R1 or R2 in FIG. 23 may be formed by a single resistor (see FIG. 25), and the resistance of the resistor may be adjusted by cutting part of the resistor (i.e., laser trimming).

Figure 24:
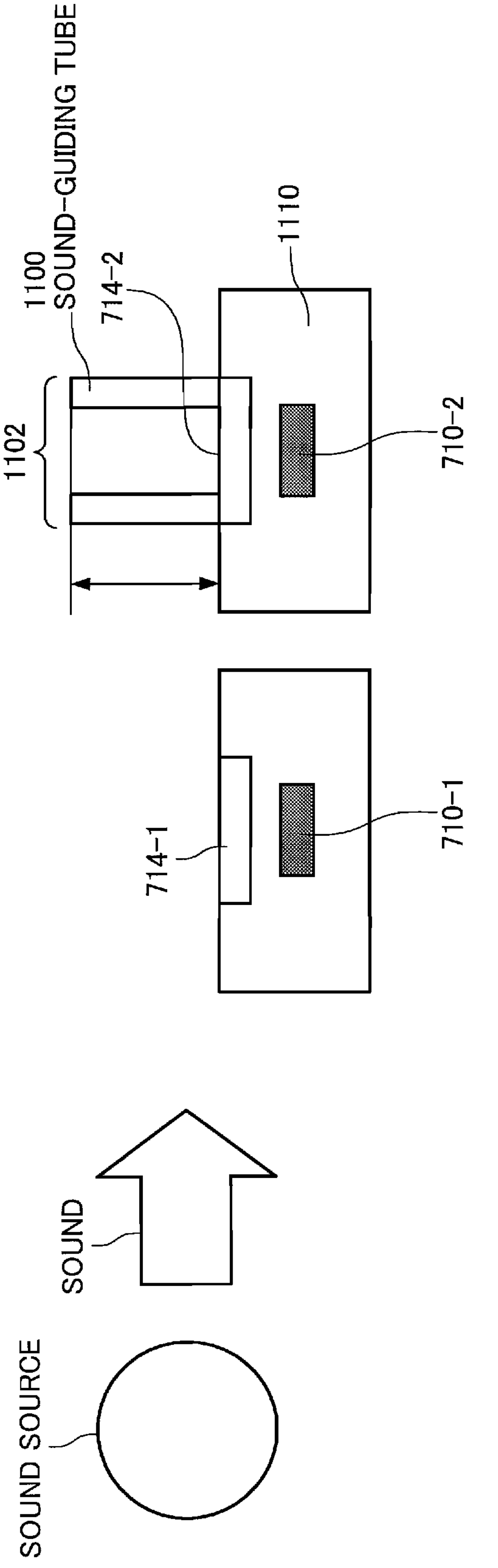
FIG. 24 illustrates an example of another configuration of an integrated circuit device.

FIG. 24 illustrates an example of yet another configuration of the integrated circuit device according to this embodiment.

The integrated circuit device according to this embodiment may include the first microphone 710-1 that includes the first diaphragm, the second microphone 710-2 that includes the second diaphragm, and the differential signal generation section (not shown) that generates the differential signal that indicates the difference between the first voltage signal obtained by the first microphone and the second voltage signal obtained by the second microphone. At least one of the first diaphragm and the second diaphragm may acquire sound waves through a tubular sound-guiding tube 1100 provided perpendicularly to the surface of the diaphragm.

The sound-guiding tube 1100 may be provided on a substrate 1110 around the diaphragm so that sound waves that enter an opening 1102 of the tube reach the diaphragm of the second microphone 710-2 through a sound hole 714-2 without leaking to the outside. Therefore, sound that has entered the sound-guiding tube 100 reaches the diaphragm of the second microphone 710-2 without being attenuated. According to this embodiment, the travel distance of sound before reaching the diaphragm can be changed by providing the sound-guiding tube corresponding to at least one of the first diaphragm and the second diaphragm. Therefore, a delay can be canceled by providing a sound-guiding tube having an appropriate length (e.g., several millimeters) corresponding to a variation in delay balance.

The invention is not limited to the above-described embodiments. Various modifications and variations may be made. The invention includes configurations that are substantially the same as the configurations described in the above embodiments (e.g., in function, method and effect, or objective and effect). The invention also includes a configuration in which an unsubstantial element of the above embodiments is replaced by another element. The invention also includes a configuration having the same effects as those of the configurations described in the above embodiments, or a configuration capable of achieving the same object as those of the above-described configurations. The invention further includes a configuration obtained by adding known technology to the configurations described in the above embodiments.

The invention claimed is:

1. An integrated circuit device comprising a circuit board, the circuit board including:

a first diaphragm that forms a first microphone;

a second diaphragm that forms a second microphone; and a differential signal generation circuit that receives a first voltage signal obtained by the first microphone and a second voltage signal obtained by the second microphone, and generates a differential signal that indicates a difference between the first voltage signal and the second voltage signal;

wherein the differential signal generation circuit includes:

a gain section that amplifies the first voltage signal obtained by the first microphone by a predetermined gain;

a differential signal output section that receives the first voltage signal amplified by the gain section and the second voltage signal obtained by the second microphone, generates a differential signal that indicates a difference between the first voltage signal amplified by the gain section and the second voltage signal, and outputs the differential signal;

an amplitude difference detection section that receives the first voltage signal and the second voltage signal input to the differential signal output section, detects a difference in amplitude between the first voltage signal and the second voltage signal when the differential signal is generated based on the first voltage signal and the second voltage signal that have been received, generates an amplitude difference signal based on the detection result, and outputs the amplitude difference signal; and a gain control section that changes an amplification factor of the gain section based on the amplitude difference signal, wherein the first microphone and the second microphone receive an equal sound pressure from a gain adjustment test sound source; and wherein the gain section change the amplification factor so that the amplitude difference signal is within a predetermined range.

2. A voice input device comprising the integrated circuit device as defined in claim 1.

3. An information processing system comprising:

the integrated circuit device as defined in claim 1; and an analysis section that analyzes input voice information based on the differential signal.

4. An information processing system comprising:

a voice input device that includes the integrated circuit device as defined in claim 1, and a communication processing device that performs a communication process through a network; and a host computer that analyzes input voice information input to the voice input device based on the differential signal acquired by a communication process through the network.

* * * * *